United States Patent
Wu (10) Patent No.: US 11,711,080 B1
(45) Date of Patent: Jul. 25, 2023

(54) OFF-CHIP DRIVING DEVICE

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/585,573

(22) Filed: Jan. 27, 2022

(51) Int. Cl.
*H03K 19/00* (2006.01)
*H03K 19/017* (2006.01)
*H03K 19/0185* (2006.01)

(52) U.S. Cl.
CPC ... *H03K 19/01721* (2013.01); *H03K 19/0005* (2013.01); *H03K 19/018585* (2013.01)

(58) Field of Classification Search
CPC ......... H03K 19/0005; H03K 19/01721; H03K 19/018585
See application file for complete search history.

(56) References Cited

U.S. PATENT DOCUMENTS

| | | | |
|---|---|---|---|
| 5,602,494 A | 2/1997 | Sundstrom | |
| 6,281,709 B1 | 8/2001 | Seyyedy | |
| 6,573,753 B1 | 6/2003 | Snyder | |
| 7,164,299 B2 * | 1/2007 | Nedachi | H03K 17/164 326/26 |
| 7,733,128 B2 * | 6/2010 | Miura | H04L 25/0282 326/86 |
| 9,385,718 B1 * | 7/2016 | Liu | H03K 19/01721 |
| 11,012,074 B1 * | 5/2021 | Wu | G11C 29/022 |
| 2003/0112042 A1 | 6/2003 | Takahashi | |
| 2006/0125520 A1 | 6/2006 | Le et al. | |
| 2007/0057691 A1 | 3/2007 | Lee | |
| 2009/0072860 A1 | 3/2009 | Lee | |
| 2010/0052751 A1 * | 3/2010 | Abe | G11C 7/1051 327/158 |
| 2013/0027092 A1 | 1/2013 | Bien | |
| 2013/0265085 A1 | 10/2013 | Kerr et al. | |
| 2015/0171863 A1 | 6/2015 | Ha | |
| 2016/0134285 A1 | 5/2016 | Ha | |
| 2017/0154668 A1 | 6/2017 | Ha | |
| 2020/0028507 A1 * | 1/2020 | Hwang | G11C 29/022 |

FOREIGN PATENT DOCUMENTS

TW 202113820 4/2021

OTHER PUBLICATIONS

"Office Action of Taiwan Counterpart Application", dated Oct. 31, 2022, p. 1-p. 6.

* cited by examiner

*Primary Examiner* — Kurtis R Bahr
(74) *Attorney, Agent, or Firm* — JCIPRNET (57) ABSTRACT

The off-chip driving (OCD) device includes a signal transition detector, a front-end driver, a first main driver, a second main driver, a first resistance provider and a second resistance provider. The signal transition detector is used to detect a transition status of an input signal to generate decision information. The front-end driver generates control signals according to the decision information, and generates driving signals according to the input signal. The first main driver and the second main driver generate an output signal to a pad according to the driving signals. The first resistance provider adjusts a first resistance between the first main driver and the pad according to a first control signal. The second resistance provider adjusts a second resistance between the second main driver and the pad according to a second control signal.

17 Claims, 10 Drawing Sheets

OFF-CHIP DRIVING DEVICE

BACKGROUND OF THE INVENTION

Field of Invention

The present invention generally relates to an off-chip driving device, and more particularly to the off-chip driving device can increase response time for signal transition.

Description of Prior Art

Figure 8:
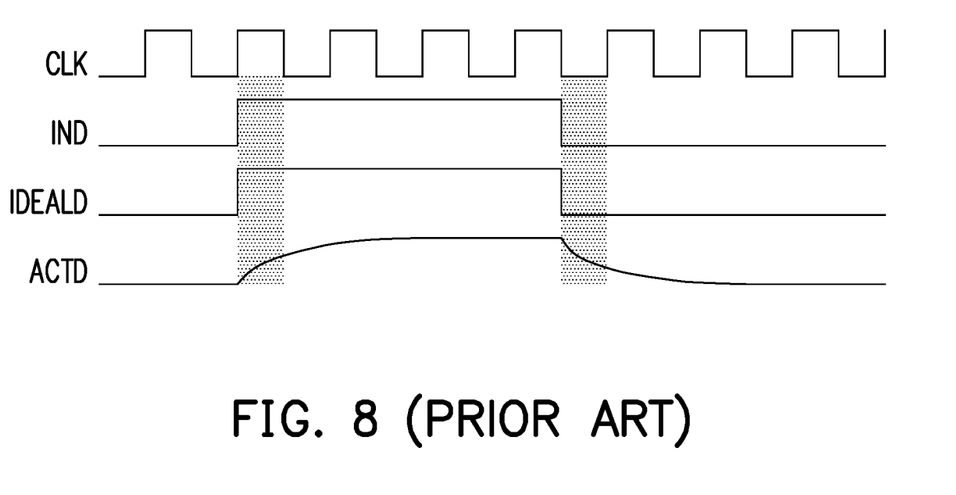
FIG. 8 illustrates a waveform plot for a high speed data transmission scheme in a conventional art.

As an operation speed of a memory device increases, an amplitude of a transmitted signal is reduced cause by a channel effect in a high speed data transmission scheme. Please refer to FIG. 8, which illustrates a waveform plot for a high speed data transmission scheme in a conventional art. In FIG. 8, an input data IND is received based on a clock signal CLK, and an ideal output data IDEALD is expected to be obtained by a receiver. It can be seen, if the period of a clock signal CLK is getting smaller, a large signal transition skew can be occurred on an actual output data ACTD. Therefore, a signal distortion is occurred in an off-chip driving device which is operated in the high speed data transmission scheme. Such as that, how to improve the signal distortion in the high speed data transmission scheme for the off-chip driving device is an important target for a designer in the art.

SUMMARY OF THE INVENTION

The present invention provides an off-chip driving device having a high transmission time.

The off-chip driving device includes an off-chip driving device. The off-chip driving (OCD) device includes a signal transition detector, a front-end driver, a first main driver, a second main driver, a first resistance provider and a second resistance provider. The signal transition detector is used to detect a transition status of an input signal to generate decision information. The front-end driver is coupled to the signal transition detector, generates a first control signal and a second control signal according to the decision information, and generates a first driving signal and a second driving signal according to the input signal. The first main driver is coupled to the front-end driver and a power end and receives the first driving signal. The second main driver is coupled to the front-end driver and a reference ground end and receives the second driving signal. Wherein the first main driver and the second main driver generate an output signal to a pad according to the first driving signal and the second driving signal. The first resistance provider is coupled between the first main driver and the pad in series, provides and adjusts a first resistance between the first main driver and the pad according to the first control signal. The second resistance provider is coupled between the second main driver and the pad in series, provides and adjusts a second resistance between the second main driver and the pad according to the second control signal.

Accordingly, present disclosure provides the off-chip driving device which can adjust resistances between the drivers and pad when the input signal is transited. That is, resistances of a charge path and a discharge path can be lowered during a signal toggle transient time when an output signal of the off-chip driving device is transited. A response time of the output signal can be decreased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings. Wherever possible, the same reference numbers are used in the drawings and the description to refer to the same or like parts.

Figure 1:
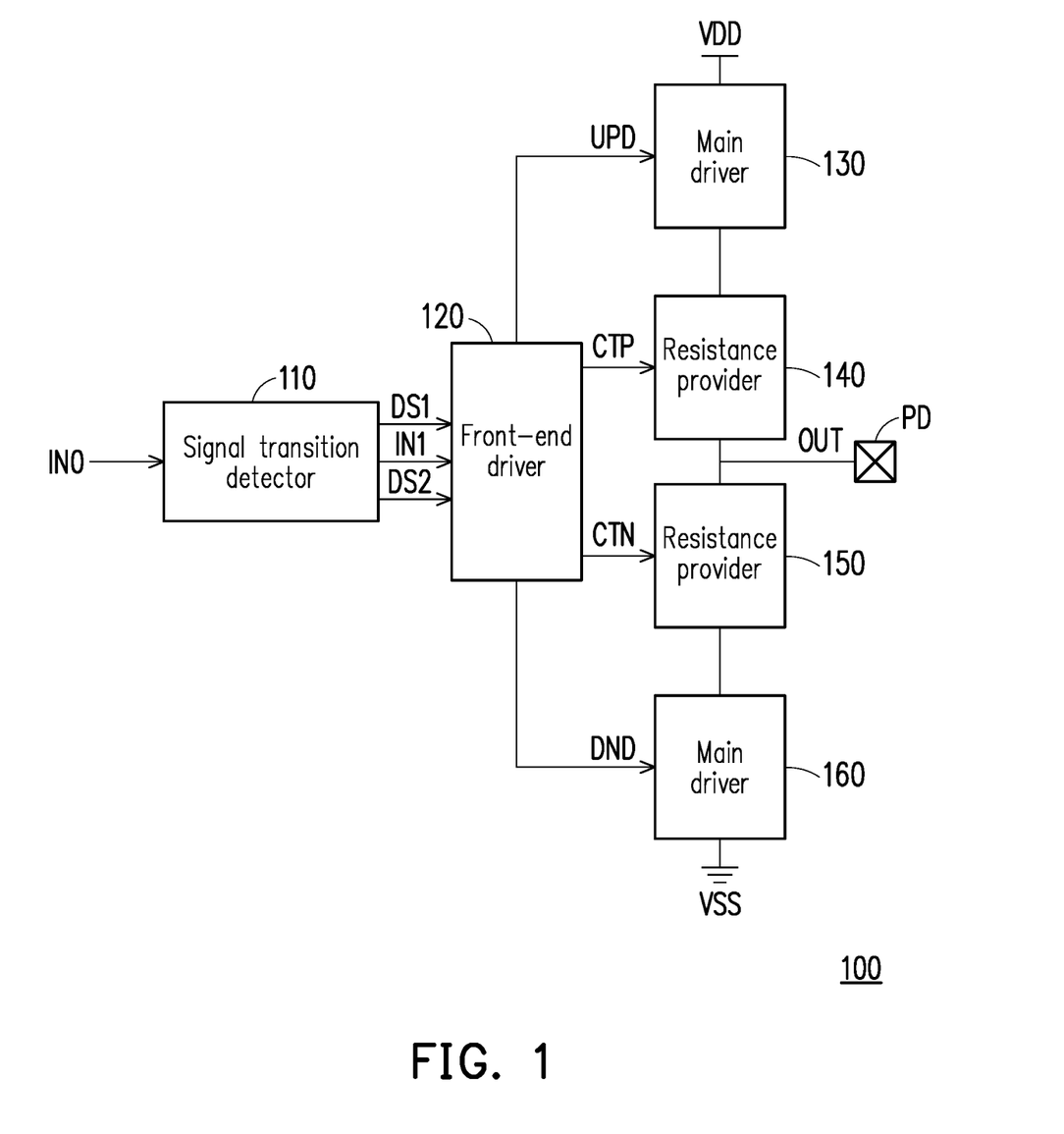
FIG. 1 illustrates a schematic diagram of an off-chip driving device according to an embodiment of present disclosure.

Please refer to FIG. 1, which illustrates a schematic diagram of an off-chip driving device according to an embodiment of present disclosure. The off-chip driving device 100 includes a signal transition detector 110, a front-end driver 120, main drivers 130, 160 and resistance providers 140 and 150. The signal transition detector 110 receives an input signal IN, and is configured to detect a transition status of the input signal IN0 to generate decision information. The decision information may include a first decision signal DS1 and a second decision signal DS2. The first decision signal DS1 is used to indicate the input signal IN0 transited from a first logic level to a second logic level and the second decision signal DS2 is used to indicate the input signal IN0 transited from the second logic level to the first logic level, where the first logic level may be logic 0 and the second logic level may be logic 1.

In some embodiment, the signal transition detector 110 may detect the transition status of the input signal IN0 to generate the first decision signal DS1 and the second decision signal DS2. When the input signal IN0 transited from logic 0 to logic 1 is detected, the signal transition detector 110 may generate a first pulse on the first decision signal DS1. When the input signal IN0 transited from logic 1 to logic 0 is detected, the signal transition detector 110 may generate a second pulse on the second decision signal DS2. The first pulse may be a positive pulse, and the second pulse may be a negative pulse.

The front-end driver 120 is coupled to the signal transition detector 110. The front-end driver 120 receives an input signal IN1, the first decision signal DS1 and the second decision signal DS2, and generates a first control signal CTP, a second control signal CTN, a first driving signal UPD and a second driving signal DND according to the first decision signal DS1, the second decision signal DS2 and the input signal IN1. In detail, the front-end driver 120 can generate the first driving signal UPD and the second driving signal DND according to the input signal IN1. Take the off-chip driving device 100 is at a non-inverting driving mode as an example. If the input signal IN1 is at logic 0, the front-end driver 120 may generate the first driving signal UPD and the second driving signal DND which both are at logic 1. If the input signal IN1 is at logic 1, the front-end driver 120 may generate the first driving signal UPD and the second driving signal DND which both are at logic 0. Such as that, the output signal OUT of the off-chip driving device 100 may be at same logic level with the input signal IN1.

On the other hand, take the off-chip driving device 100 is at an inverting driving mode as an example. If the input signal IN1 is at logic 0, the front-end driver 120 may generate the first driving signal UPD and the second driving signal DND which both are at logic 0. If the input signal IN1 is at logic 1, the front-end driver 120 may generate the first driving signal UPD and the second driving signal DND which both are at logic 1. Such as that, the output signal OUT of the off-chip driving device 100 may be at same logic level with the input signal IN1.

On the other hand, the front-end driver 120 may generate the first control signal CTP and the second control signal CTN according to the first decision signal DS1 and the second decision signal DS2, respectively.

The main driver 130 is coupled to a power end for receiving a power voltage VDD. The main driver 130 is also coupled to the front-end driver 120. The main driver 160 is coupled to a reference ground end for receiving a reference ground voltage VSS. The main driver 160 is also coupled to the front-end driver 120, too. The main driver 130 receives the first driving signal UPD and provides a driving path to pull up the output signal OUT. The main driver 160 receives the second driving signal DND and provides a driving path to pull down the output signal OUT. The resistance provider 140 is coupled between a pad PD and the main driver 130. The resistance provider 150 is coupled between the pad PD and the main driver 160. The main driver 130 and the resistance provider 140, in combination, provide a pull up resistance for the off-chip driving device 100. The main driver 160 and the resistance provider 150, in combination, provide a pull down resistance for the off-chip driving device 100. On the other hand, the resistance providers 140 and 150 are used to an Electrostatic discharge (ESD) protection device for the main driver 130 and 160, respectively. It should be noted here, a resistance of the resistance provider 140 can be adjusted according to the decision signal CTP, and a resistance of the resistance provider 150 can be adjusted according to the decision signal CTN.

In detail, if the input signal IN is not transited between 2 logic levels, the resistances of the resistance provider 140 and 150 may be kept unchanged. One of the main drivers 130 and 160 is activated to drive to output signal OUT to be at logic 0 or 1. If the input signal IN is transited from logic 0 to logic 1, the main driver 130 is activated and the main driver 160 is disabled. The main driver 130 may pull up the output signal OUT to logic 1 according to the first driving signal UPD and the resistance provider 140 may reduce the resistance according to the first control signal CTP.

On the contrary, if the input signal IN is transited from logic 1 to logic 0, the main driver 160 is activated and the main driver 130 is disabled. The main driver 160 may pull down the output signal OUT to logic 0 according to the second driving signal DND and the resistance provider 150 may reduce the resistance according to the second control signal CTN.

It can be seen, in this embodiment, when the output signal OUT is transited according to the input signal IN, one of the resistance providers 140 and 150 can reduce the corresponding resistance between the pad PD and the main drivers 130 or 160. That is, a driving ability of one of the main drivers 130 or 160 is not affected by the resistance providers 140 or 150, and the output signal OUT can be transited to a correct logic level. A transition delay of the off-chip driving device 100 can be reduced.

About hardware structure, in present disclosure, the signal transition detector 110 can be implemented by any signal transition detecting circuit well known by a person skilled in the art. The front-end driver 120 can be implemented by a digital circuit and can be construct with one or more logic gates and output buffers. In some embodiment, the front-end driver 120 may further include a ZQ calibration control related circuit, a slew rate control circuit and ODT (on-die termination) control circuit . . . , etc.

Figure 2A:
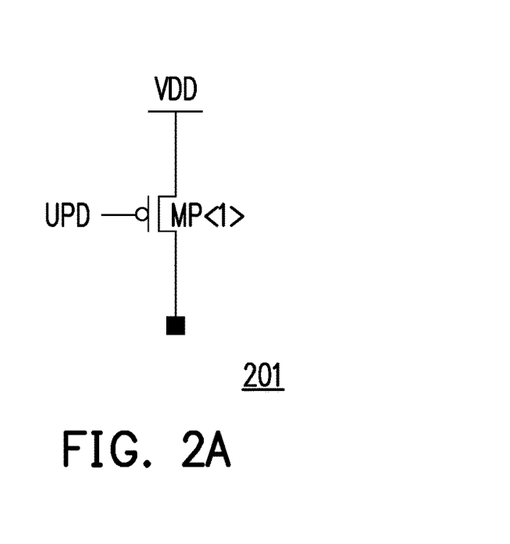
FIG. 2A to FIG. 2D illustrate main drivers of a off-chip driving device according to different embodiments of present disclosure.

Please refer to FIG. 2A to FIG. 2D, which illustrate main drivers of a off-chip driving device according to different embodiments of present disclosure. In FIG. 2A, a main driver 201 include a transistor MP<1>. A first end of the transistor MP<1> receives a power voltage VDD, a second end of the transistor MP<1> may be coupled to a corresponding resistance provider, and a control end of the transistor MP<1> receives a first driving signal UPD. The transistor MP<1> is a P-type transistor and when the first driving signal UPD is at logic 0, the transistor MP<1> can be turned-on to drive (pull up) the second end of the transistor MP<1> to the power voltage VDD. On the contrary, when the first driving signal UPD is at logic 1, the transistor MP<1> is cut-off.

Figure 2B:
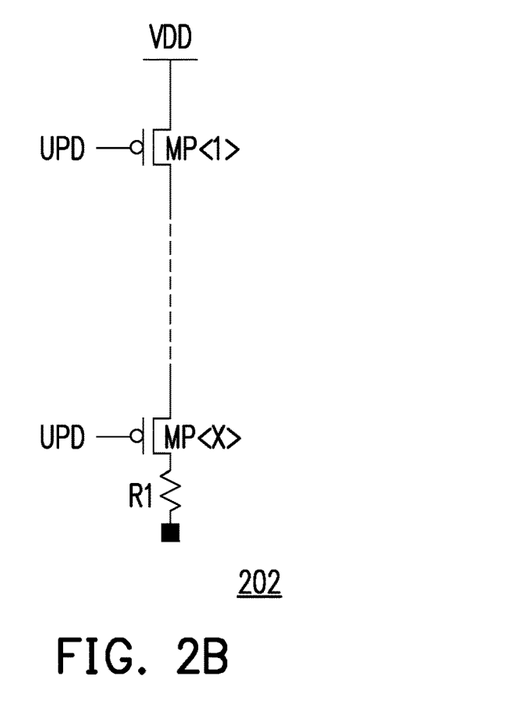

In FIG. 2B, the main driver 202 includes a plurality of transistors MP<1> to MP<X> and a resistor R1. The transistors MP<1> to MP<X> and the resistor R1 are coupled in series, and controlled by the same first driving signal UPD. The transistors MP<1> to MP<X> may be turned-on simultaneously to drive (pull up) a second end of the transistor MP<X> to the power voltage VDD according to the first driving signal UPD. Also, the transistors MP<1> to MP<X> may be cut-off simultaneously according to the first driving signal UPD. A number of the transistors MP<1> to MP<X> can be determined by a designer and is not limited.

In FIG. 2A and FIG. 2B, both of the main drivers 201 and 202 used to implement the main driver 130 as shown in FIG. 1. In some embodiment, a resistor may be embedded in the main driver 201, and another resistor may be embedded in the main driver 202, too.

Figure 2C:
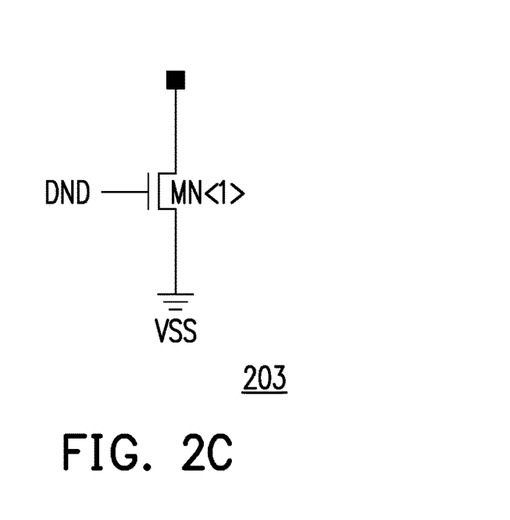

In FIG. 2C, a main driver 203 include a transistor MN<1>. A first end of the transistor MN<1> may be coupled to a corresponding resistance provider, a second end of the transistor MN<1> receives a reference ground voltage VSS, and a control end of the transistor MN<1> receives a second driving signal DND. The transistor MN<1> is a N-type transistor and when the second driving signal DND is at logic 1, the transistor MN<1> can be turned-on to drive (pull down) the first end of the transistor MN<1> to the reference ground voltage VSS. On the contrary, when the second driving signal DND is at logic 0, the transistor MN<1> is cut-off.

Figure 2D:
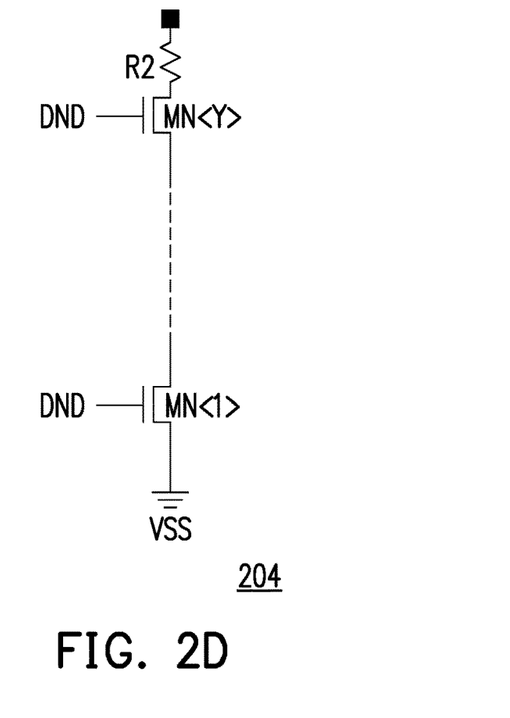

In FIG. 2D, the main driver 204 includes a plurality of transistors MN<1> to MN<Y> and a resistor r2. The transistors MN<1> to MN<Y> and the resistor R2 are coupled in series, and controlled by the same second driving signal DND. The transistors MN<1> to MN<Y> may be turned-on simultaneously to drive (pull down) a first end of the transistor MN<Y> to the reference ground voltage VSS according to the second driving signal DND. Also, the transistors MN<1> to MN<Y> may be cut-off simultaneously according to the second driving signal DND. A number of the transistors MN<1> to MN<Y> can be determined by a designer and is not limited.

In the embodiments of FIG. 2B and FIG. 2D, a number of the transistors MP<1> to MP<X> and a number of the transistors MN<1> to MN<Y> may be same or different, and no more special limitation.

Figure 3A:
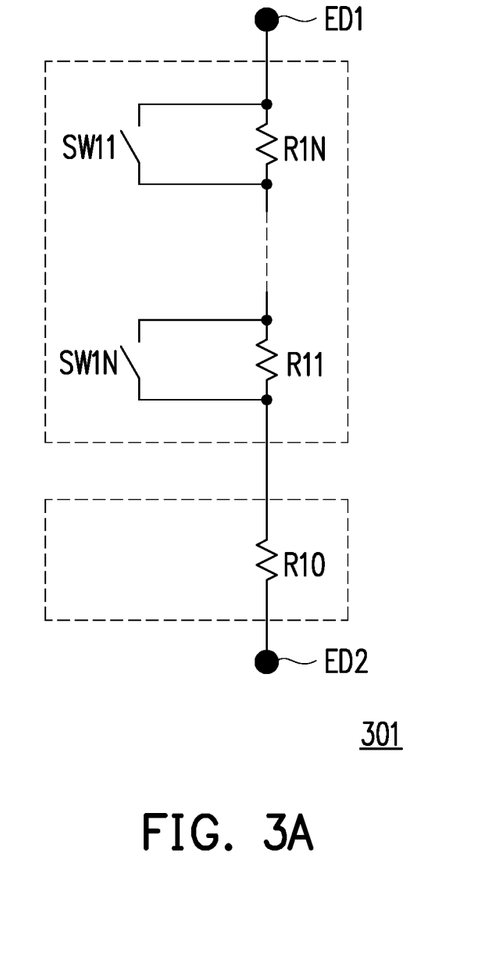
FIGS. 3A and 3B illustrate resistance providers of an off-chip driving device according different embodiments of present disclosure.
Figure 3B:
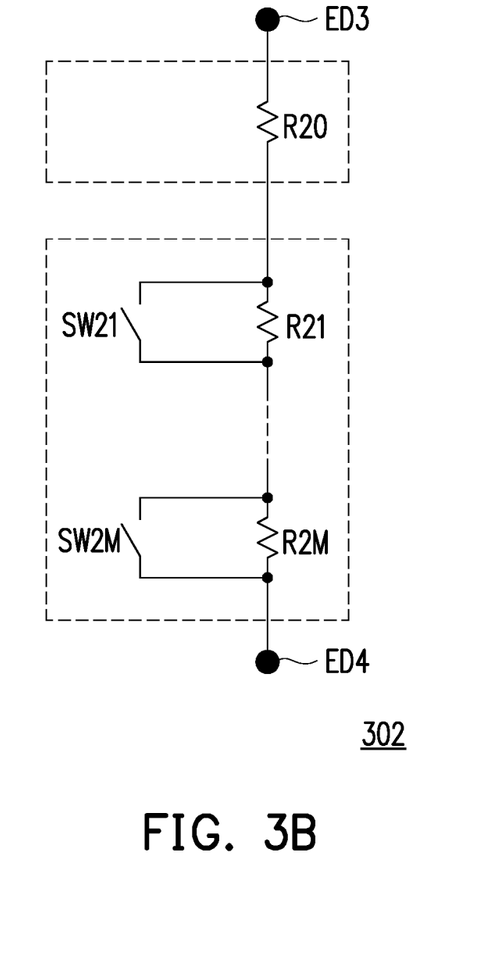

Refer to FIGS. 3A and 3B, which illustrate resistance providers of an off-chip driving device according different embodiments of present disclosure. In FIG. 3A, the resistance provider 301 has a first end ED1 and a second end ED2. The first end ED1 of the resistance provider 301 is used to couple to a corresponding main driver, such as the main driver 130 in FIG. 1. The second end ED2 of the resistance provider 301 is used to couple to a pad.

The resistance provider 301 includes N+1 resistors R10-R1N and N switches SW11-SW1N, where N is a positive integer. The resistors R1N-R10 are coupled between the first end ED1 and the second end ED2. The switches SW11-SW1N are respectively coupled to the resistor R11-R1N in parallel. The switches SW11-SW1N may be controlled by a same control signal to be turned on or cut-off. When all the switches SW11-SW1N are turned on, the resistance provider 301 provides a minimum resistance equal to the resistance of the resistor R10. On the contrary, when all the switches SW11-SW1N are cut-off, the resistance provider 301 provides a maximum resistance equal to a summation of all the resistances of the resistors R10-R1N.

In FIG. 3B, the resistance provider 302 has a first end ED3 and a second end ED4. The first end ED3 of the resistance provider 302 is used to couple to a pad. The second end ED4 of the resistance provider 302 is used to couple to corresponding main driver, such as the main driver 160 in FIG. 1.

The resistance provider 302 includes M+1 resistors R20-R2M and M switches SW21-SW2M, where M is a positive integer. The resistors R20-R2M are coupled between the first end ED3 and the second end ED4. The switches SW21-SW2M are respectively coupled to the resistor R21-R2M in parallel. The switches SW21-SW2M may be controlled by a same control signal to be turned on or cut-off. When all the switches SW21-SW2M are turned on, the resistance provider 302 provides a minimum resistance equal to the resistance of the resistor R20. On the contrary, when all the switches SW21-SW2M are cut-off, the resistance provider 302 provides a maximum resistance equal to a summation of all the resistances of the resistors R20-R2M.

In the embodiments of FIG. 3A and FIG. 3B, a number of the resistors R10-R1N and a number of the resistors R20-R2M may be same or different, and no more special limitation.

Figure 4A:
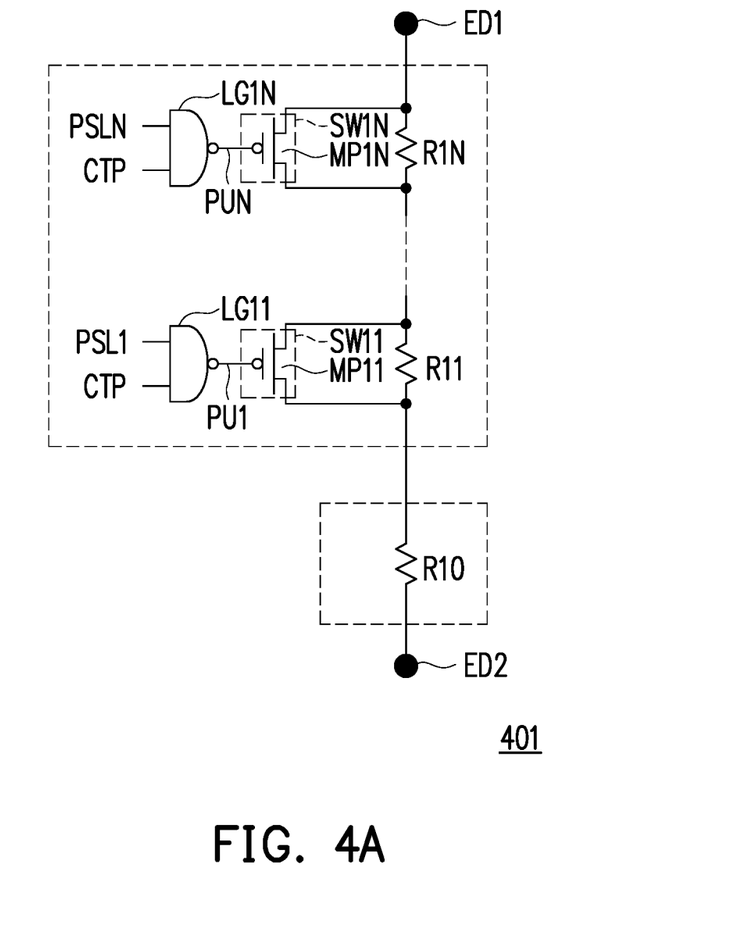
FIGS. 4A and 4B illustrate resistance providers of an off-chip driving device according other embodiments of present disclosure.
Figure 4B:
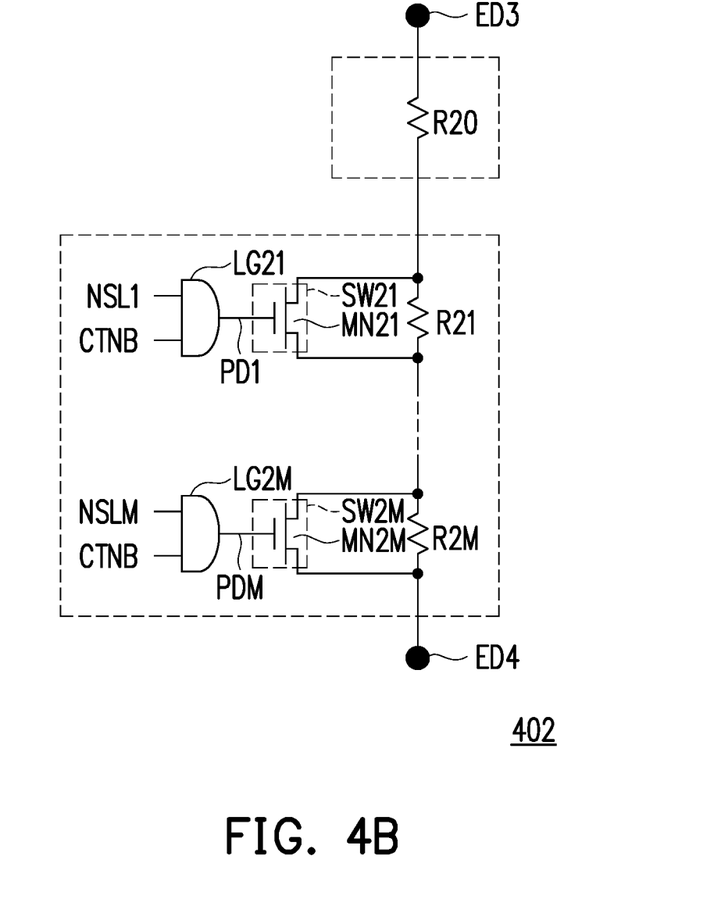

Refer to FIGS. 4A and 4B, which illustrate resistance providers of an off-chip driving device according other embodiments of present disclosure. In FIG. 4A, the resistance provider 401 includes N+1 resistors R10-R1N, N switches SW11-SW1N and N logic circuits LG11-LG1N, where N is a positive integer. The resistors R10-R1N are coupled in series between a second end ED2 and a first end ED1 of the resistance provider 401. The switches SW11-SW1N are respectively formed by transistors MP11-MP1N, and the switches SW11-SW1N are respectively coupled to the resistors R11-R1N in parallel. In this embodiment, the transistors MP11-MP1N are all P-type transistors. The logic circuits LG11-LG1N are respectively coupled to control ends of the transistors MP11-MP1N. The logic circuits LG11-LG1N commonly receive a first control signal CTP and respectively receive selection signals PSL1-PSLN. The logic circuits LG11-LG1N respectively generate output signals PU1-PUN. In FIG. 4A, the logic circuits LG11-LG1N are all NAND gates.

The selection signals PSL1-PSLN can be generated by the front-end driver 120 in the embodiment of FIG. 1. Take the logic circuit LG11 as an example. In this embodiment, when the selection signals PSL1 is at logic 0, the logic circuit LG11 may generate the output signal PU1 a logic 1 to cut-off the switch SW11, and when the selection signals PSL1 is at logic 1, the logic circuit LG11 may invert the first control signal CTP to generate the output signal PU1 to control the switch SW11. That is, the selection signals PSL1-PSLN can be used to control a turned-on number of the switches SW11-SW1N to adjust a resistance of the resistance provider 401.

In FIG. 4B, the resistance provider 402 includes M+1 resistors R20-R2M, M switches SW21-SW2M and M logic circuits LG21-LG2M, where M is a positive integer. The resistors R20-R2M are coupled in series between a second end ED3 and a first end ED4 of the resistance provider 402. The switches SW21-SW2M are respectively formed by transistors MN21-MN2M, and the switches SW21-SW2M are respectively coupled to the resistors R21-R2M in parallel. In this embodiment, the transistors MN21-MN2M are all N-type transistors. The logic circuits LG21-LG2M are respectively coupled to control ends of the transistors MN21-MN2M. The logic circuits LG21-LG2M commonly receive a second control signal CTNB and respectively receive selection signals NSL1-NSLM. The logic circuits LG21-LG2M respectively generate output signals PD1-PDM. In FIG. 4B, the logic circuits LG21-LG2M are all AND gates.

The selection signals NSL1-NSLN can be generated by the front-end driver 120 in the embodiment of FIG. 1. Take the logic circuit LG21 as an example. In this embodiment, when the selection signals NSL1 is at logic 0, the logic circuit LG21 may output a logic 0 to cut-off the switch SW21, and when the selection signals NSL1 is at logic 1, the logic circuit LG21 may output the second control signal CTN to control the switch SW21. That is, the selection signals NSL1-NSLM can be used to control a turned-on number of the switches SW21-SW2M to adjust a resistance of the resistance provider 402.

Figure 5A:
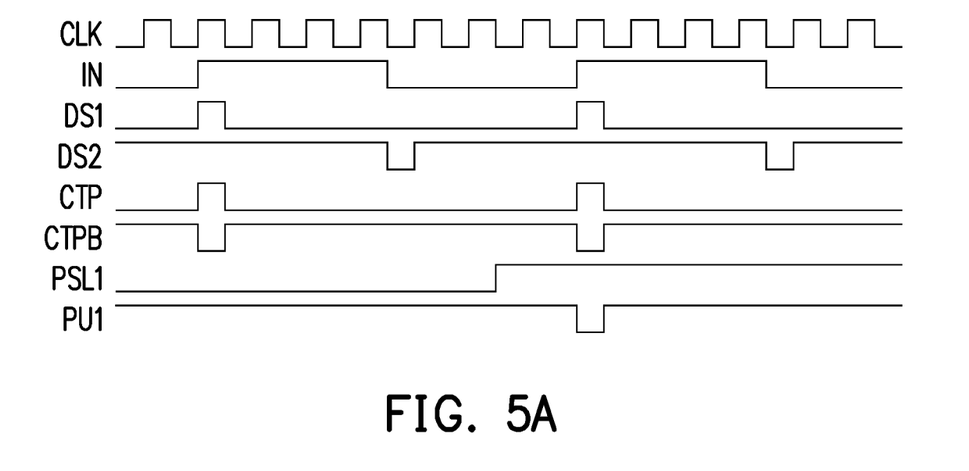
FIG. 5A is a waveform plot of the resistance provider according to the embodiments of FIG. 4A of present disclosure.

Please refer to FIG. 1, FIG. 4A and FIG. 5A commonly, where FIG. 5A is a waveform plot of the resistance provider according to the embodiments of FIG. 4A of present disclosure. The off-chip driving device 100 can be operated based on a clock signal CLK. The signal transition detector 110 can detects a transition status of the input signal IN to generate a first detection signal DS1 and a second detection signal DS2. When the input signal IN is transited from logic 0 to logic 1, the signal transition detector 110 generate the first detection signal DS1 with a positive pulse, and when the input signal IN is transited from logic 1 to logic 0, the signal transition detector 110 generate the second detection signal DS2 with a negative pulse. Widths of the positive pulse and the negative pulse can be determined by a designer of the off-chip driving device 100 and no special limitation. It should be noted here, in some embodiment, the signal transition detector 110 may be merged into the front-end driver 120. A designer can decide to whether merge the signal transition detector 110 into the front-end driver 120 or not by design requirement. Also, the signal transition detector 110 can be designed to be operated with or without a clock signal.

The front-end driver 120 generates the first control signal CTP according to the first detection signal DS1. In here, waveforms of the first control signal CTP and the first detection signal DS1 are same. The front-end driver 120 further generates the selection signal PSL1. Take the logic circuit LG11 as an example. When the selection signal PSL1 is at logic 0, the output signal PU1 of the logic circuit LG11 is kept at logic 1. Such as that, the corresponding switch SW11 is kept on cut-off state. Moreover, when the selection signal PSL1 is at logic 1, the output signal PU1 of the logic circuit LG11 equals to an inverted signal of the first control signal CTP. The negative pulse on the output signal PU1 can turned on the switch SW11 when the input signal IN is transited from logic 0 to logic 1.

Figure 5B:
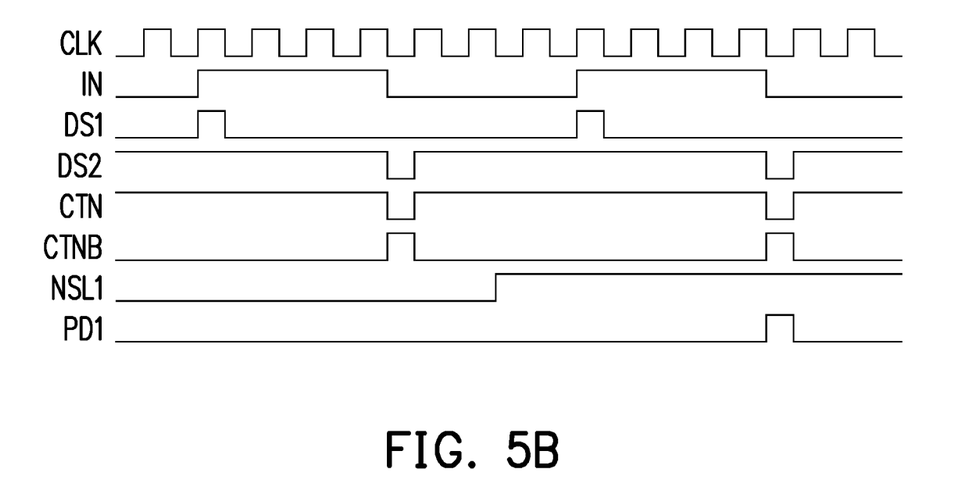
FIG. 5B is a waveform plot of the resistance provider according to the embodiments of FIG. 4B of present disclosure.

Please refer to FIG. 1, FIG. 4B and FIG. 5B commonly, where FIG. 5B is a waveform plot of the resistance provider according to the embodiments of FIG. 4B of present disclosure. The off-chip driving device 100 can be operated based on a clock signal CLK. The signal transition detector 110 can detects a transition status of the input signal IN to generate a first detection signal DS1 and a second detection signal DS2. When the input signal IN is transited from logic 0 to logic 1, the signal transition detector 110 generate the first detection signal DS1 with a positive pulse, and when the input signal IN is transited from logic 1 to logic 0, the signal transition detector 110 generate the second detection signal DS2 with a negative pulse. Widths of the positive pulse and the negative pulse can be determined by a designer of the off-chip driving device 100 and no special limitation.

The front-end driver 120 generates the second control signal CTN according to the second detection signal DS2. In here, waveforms of the second control signal CTN and the second detection signal DS2 are same. The front-end driver 120 further generates the selection signal NSL1. Take the logic circuit LG21 as an example. When the selection signal NSL1 is at logic 0, the output signal PD1 of the logic circuit LG21 is kept at logic 0. Such as that, the corresponding switch SW21 is kept on cut-off state. Moreover, when the selection signal NSL1 is at logic 1, the output signal PD1 of the logic circuit LG21 equals to an inverted signal CTNB of the second control signal CTN. The positive pulse on the output signal PD1 can turned on the switch SW21 when the input signal IN is transited from logic 1 to logic 0.

Figure 6A:
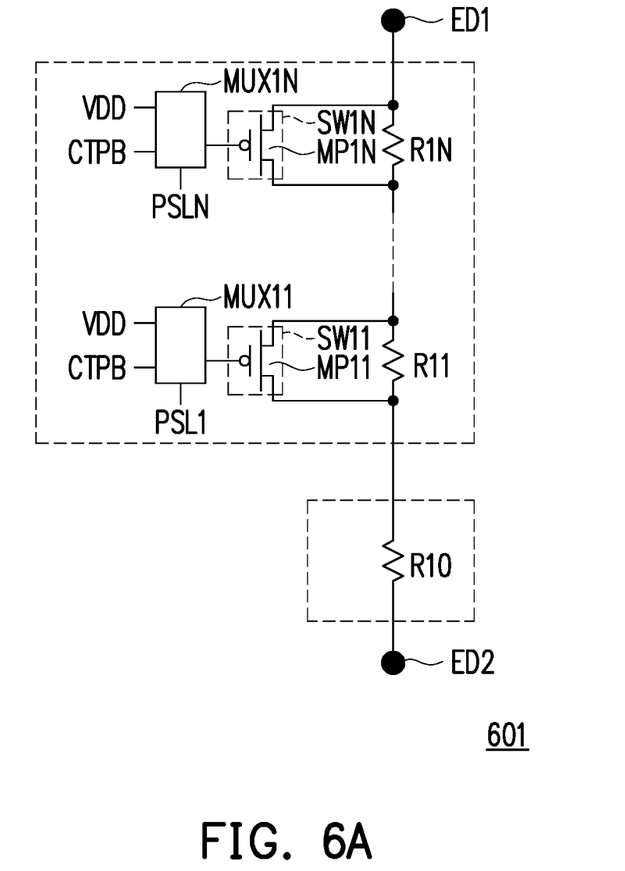
FIGS. 6A and 6B illustrate resistance providers of an off-chip driving device according other embodiments of present disclosure.
Figure 6B:
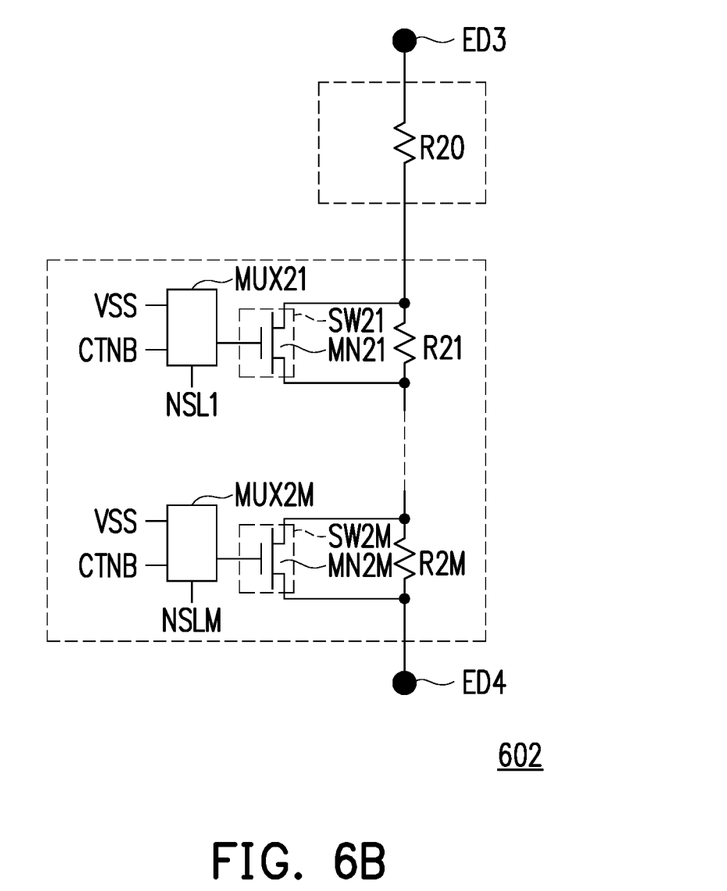

Refer to FIGS. 6A and 6B, which illustrate resistance providers of an off-chip driving device according other embodiments of present disclosure. In FIG. 6A, the resistance provider 601 includes N+1 resistors R10-R1N, N switches SW11-SW1N and N multiplexers MUX11-MUX1N, where N is a positive integer. The resistors R10-R1N are coupled in series between a second end ED2 and a first end ED1 of the resistance provider 601. The switches SW11-SW1N are respectively formed by transistors MP11-MP1N, and the switches SW11-SW1N are respectively coupled to the resistors R11-R1N in parallel. In this embodiment, the transistors MP11-MP1N are all P-type transistors. The multiplexers MUX11-MUX1N are respectively coupled to control ends of the transistors MP11-MP1N. The multiplexers MUX11-MUX1N commonly receive an inverted signal CTPB of a first control signal CTP and respectively receive selection signals PSL1-PSLN. The multiplexers MUX11-MUX1N respectively generate output signals to control the switches SW11-SW1N.

Take the multiplexers MUX11 as an example. The multiplexers MUX11 selects one of a power voltage VDD and the inverted signal CTPB to generate the output signal according to the selection signal PSL1. If the selection signal PSL1 is at logic 0, the multiplexers MUX11 output the power voltage VDD to a control end of the switch SW11, and the switch SW11 can be cut-off accordingly. On the contrary, if the selection signal PSL1 is at logic 1, the multiplexers MUX11 output the inverted signal CTPB to control the switch SW11, and the switch SW11 can be turned on if the inverted signal CTPB is at logic 0. At this time, the input signal for the off-chip driving device may be transited from logic 0 to logic 1.

In FIG. 6B, the resistance provider 602 includes M+1 resistors R20-R2M, M switches SW21-SW2M and M multiplexers MUX21-MUX2M, where M is a positive integer. The resistors R20-R2M are coupled in series between a second end ED3 and a first end ED4 of the resistance provider 602. The switches SW21-SW2M are respectively formed by transistors MN21-MN2M, and the switches SW21-SW2M are respectively coupled to the resistors R21-R2M in parallel. In this embodiment, the transistors MN21-MN2M are all N-type transistors. The multiplexers MUX21-MUX2M are respectively coupled to control ends of the transistors MN21-MN2M. The 1 multiplexers MUX21-MUX2M commonly receive an inverted signal CTNB of a second control signal CTN and respectively receive selection signals NSL1-NSLM. The logic circuits MUX21-MUX2M respectively generate output signals to control switches SW21-SW2M.

Take the multiplexers MUX21 as an example. The multiplexers MUX21 selects one of a reference ground voltage VSS and the inverted signal CTNB to generate the output signal according to the selection signal NSL1. If the selection signal NSL1 is at logic 0, the multiplexers MUX21 output the reference ground voltage VSS to a control end of the switch SW21, and the switch SW21 can be cut-off accordingly. On the contrary, if the selection signal NSL1 is at logic 1, the multiplexers MUX21 output the inverted signal CTNB to control the switch SW21, and the switch SW21 can be turned on if the inverted signal CTNB is at logic 1. At this time, the input signal for the off-chip driving device may be transited from logic 1 to logic 0.

Figure 7:
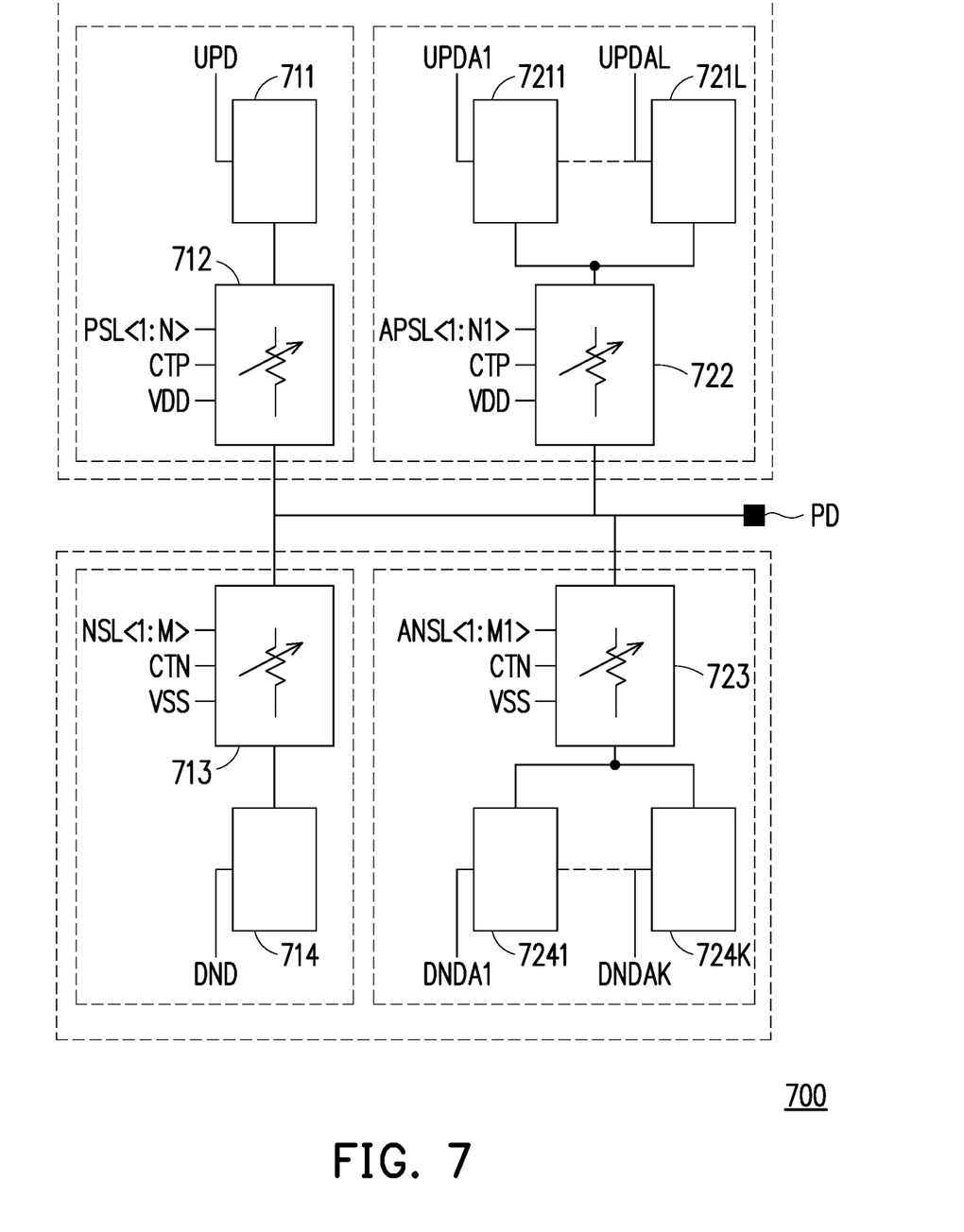
FIG. 7 illustrates a schematic diagram of partial circuit of an off-chip driving device according to an embodiment of present disclosure.

Please refer to FIG. 7, which illustrates a schematic diagram of partial circuit of an off-chip driving device according to an embodiment of present disclosure. In FIG. 7, a signal transmission detector and a front-end driver of the off-chip driving device 700 are not illustrated. The off-chip driving device 700 includes main drivers 711, 714, resistance providers 712, 713, auxiliary drivers 7211-721L, 7241-724K, and auxiliary resistance providers 722 and 723. The main driver 711, the resistance providers 712, 713 and the main driver 714 are coupled in series. A coupled end of the resistance providers 712 and 713 is also coupled to a pad PD. The auxiliary drivers 7211-721L are coupled in parallel, the auxiliary drivers 7241-724K are coupled in parallel, and the auxiliary resistance providers 722 and 723 are coupled in series between the auxiliary drivers 7211-721L and the auxiliary drivers 7241-724K. A coupled end of the auxiliary resistance providers 722 and 723 is also coupled to the pad PD.

In this embodiment, the main driver 711 is a pull-up driver and controlled by a first driving signal UPD. The main driver 714 is a pull-down driver and controlled by a second driving signal DND. The auxiliary drivers 7211-721L are pull-up drivers, and respectively controlled by a plurality of auxiliary driving signal UPDA1-UPDAL. The auxiliary drivers 7241-724K are pull-up drivers, and respectively controlled by a plurality of auxiliary driving signals DNDA1-DNDAK.

The resistance provider 712 receives a selection signal PSL<1:N> and a first control signal CTP. The resistance provider 712 adjusts a provided resistance according to the selection signal PSL<1:N>, the first control signal CTP and a power voltage VDD. The resistance provider 713 receives a selection signal NSL<1:M>, a second control signal CTN and a reference ground voltage VSS. The resistance provider 713 adjusts a provided resistance according to the selection signal NSL<1:M>, the second control signal CTN and the reference ground voltage VSS.

The auxiliary resistance provider 722 receives a selection signal APSL<1:N1> and the first control signal CTP. The resistance provider 722 adjusts a provided resistance according to the selection signal APSL<1:N1>, the first control signal CTP and the power voltage VDD. The auxiliary resistance provider 723 receives a selection signal ANSL<1:M1>, a second control signal CTN and a reference ground voltage VSS. The resistance provider 713 adjusts a provided resistance according to the selection signal ANSL<1:M1>, the second control signal CTN and the reference ground voltage VSS.

Each of the auxiliary drivers 7211-721L and the main driver 711 may, decided by a designer, have same circuit structure or different circuit structures. Also, each of the auxiliary drivers 7241-724K and the main driver 714 may, decided by the designer, have same circuit structure or different circuit structures. The auxiliary resistance provider 722 and the resistance provider 712 may have same circuit structure. The auxiliary resistance provider 723 and the resistance provider 713 may have same circuit structure. Also, number of N and N1 may be same or different, number of M and M1 may be same or different, and no special limitation here. That is, detail operation of the auxiliary drivers 7211-721L, the auxiliary drivers 7241-724K and the auxiliary resistance providers 722 and 723 can be easily known by referring to the embodiments mentioned above, and no more repeated description here.

In this embodiment, the auxiliary resistance providers 722 and 723 are configured to perform impedance match and ESD protection function for the off-chip driving device 700. The auxiliary drivers 7211-721L and 7241-724K are configured to adjust a driving ability of the off-chip driving device 700. In this embodiment, the main driver 711, the resistance provider 712, the auxiliary drivers 7211-721L and the auxiliary resistance provider 722 form a pull up resistor required by the off-chip driving device 700, and provide a driving current for the off-chip driving device 700. The main driver 714, the resistance provider 713, the auxiliary drivers 7241-724K and the auxiliary resistance provider 723 form a pull down resistor required by the off-chip driving device 700, and provide a sinking current for the off-chip driving device 700.

In summary, the off-chip driving device can adjust a resistance between a pad and a main driver (an output driver stage for the off-chip driving device) of the off-chip driving device when an input signal is transited. That is, the off-chip driving device can increase a driving ability when an output signal of the off-chip driving device needs to transit corresponding to the transition of the input signal. That is, a transition delay of the off-chip driving device can be reduced, a signal transition slew rate can be improved, and a performance of the off-chip driving device can be increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An off-chip driving device, comprising:
   a signal transition detector, detecting a transition status of an input signal to generate decision information;
   a front-end driver, coupled to the signal transition detector, generating a first control signal and a second control signal according to the decision information, and generating a first driving signal and a second driving signal according to the input signal;
   a first main driver, coupled to the front-end driver and a power end, receiving the first driving signal;
   a second main driver, coupled to the front-end driver and a reference ground end and receiving the second driving signal, wherein the first main driver and the second main driver generate an output signal to a pad according to the first driving signal and the second driving signal;
   a first resistance provider, coupled between the first main driver and the pad in series, providing and adjusting a first resistance between the first main driver and the pad according to the first control signal, wherein the first resistance provider comprises:
   N+1 first resistors, coupled between the first main driver and the pad in series, where N is a positive integer; and
   N first switches, coupled with N resistors of the N+1 first resistors in parallel,
   wherein the N first switches are turned on or cut-off according to the first control signal; and
   a second resistance provider, coupled between the second main driver and the pad in series, providing and adjusting a second resistance between the second main driver and the pad according to the second control signal.

2. The off-chip driving device according to claim 1, wherein the second resistance provider comprises:
   M+1 second resistors, coupled between the second main driver and the pad in series, where M is a positive integer; and
   M second switches, coupled with M resistors of the M+1 second resistor in parallel,
   wherein the M second switches are controlled by the second control signal to be turned on or cut-off.

3. The off-chip driving device according to claim 2, wherein the front-end driver further generates a first selection signal and a second selection signal, and the first resistance provider determines a first target value of the first resistance according to the first selection signal and the first control signal, and the second resistance provider determines a second target value of the second resistance according to the second selection signal and the second control signal.

4. The off-chip driving device according to claim 3, wherein the first resistance provider comprises:

N first logic circuits, coupled to the N first switches, wherein each of the N first logic circuits has two input ends respectively receiving the first selection signal and the first control signal, and each of the N first logic circuits has an output end coupled to each of the N first switches.

5. The off-chip driving device according to claim 4, wherein the second resistance provider comprises:
M second logic circuits, coupled to the M second switches, wherein each of the M second logic circuits has two input ends respectively receiving the second selection signal and an inverted signal of the second control signal, and each of the M second logic circuit has an output end coupled to each of the M second switches.

6. The off-chip driving device according to claim 5, wherein each of the M first switches is formed by a P-type transistor, and each of the M second switches is formed by a N-type transistor.

7. The off-chip driving device according to claim 5, wherein the each of the N first logic circuit is formed by a NAND gate.

8. The off-chip driving device according to claim 5, wherein and each of the M second logic circuits is formed by an AND gate.

9. The off-chip driving device according to claim 5, wherein each of the N-first logic circuits is formed by a first multiplexer, wherein each of the first multiplexers selects one of a power voltage and an inverted signal of the first control signal according to the first selection signal, and each of the first multiplexers controls each of the N first switches.

10. The off-chip driving device according to claim 5, wherein each of the M second logic circuits is formed by a second multiplexer, wherein each of the second multiplexers selects one of a ground voltage and the second control signal according to the second selection signal, and each of the second multiplexers controls the each of the M second switches.

11. The off-chip driving device according to claim 2, wherein a first turned-on number of the N first switches is determined by the first selection signal, and a second turned-on number of the M-1 second switches is determined by the second selection signal.

12. The off-chip driving device according to claim 1, wherein the decision information comprises a first decision signal and a second decision signal, the signal transition detector generates a first pulse on the first decision signal when the input signal in transited from a first logic value to a second logic value, and the signal transition detector generates a second pulse on the second decision signal when the input signal in transited from the second logic value to the first logic value.

13. The off-chip driving device according to claim 12, wherein the first logic value is logic 1, and the second logic value is logic 0.

14. The off-chip driving device according to claim 12, wherein the first pulse is a positive pulse and the second pulse is a negative pulse.

15. The off-chip driving device according to claim 1, further comprising:

at least one first auxiliary driver, coupled to the power end and the front-end driver, receiving at least one first auxiliary driving signal; and a first auxiliary resistance provider, coupled between the first auxiliary driver and the pad in series, providing and adjusting a first auxiliary resistance between the first auxiliary driver and the pad according to the first auxiliary control signal.

16. The off-chip driving device according to claim 1, further comprising:

at least one second auxiliary driver, coupled to the reference ground end and the front-end driver, receiving at least one second auxiliary driving signal, wherein a first auxiliary driver and the second auxiliary driver generate an auxiliary output signal to the pad according to the first auxiliary driving signal and the second auxiliary driving signal; and a second auxiliary resistance provider, between the second main driver and the pad in series, providing and adjusting a second auxiliary resistance between the second auxiliary driver and the pad according to the second auxiliary control signal.

17. An off-chip driving device, comprising:

a signal transition detector, detecting a transition status of an input signal to generate decision information;

a front-end driver, coupled to the signal transition detector, generating a first control signal and a second control signal according to the decision information, and generating a first driving signal and a second driving signal according to the input signal;

a first main driver, coupled to the front-end driver and a power end, receiving the first driving signal;

a second main driver, coupled to the front-end driver and a reference ground end and receiving the second driving signal, wherein the first main driver and the second main driver generate an output signal to a pad according to the first driving signal and the second driving signal;

a first resistance provider, coupled between the first main driver and the pad in series, providing and adjusting a first resistance between the first main driver and the pad according to the first control signal; and a second resistance provider, coupled between the second main driver and the pad in series, providing and adjusting a second resistance between the second main driver and the pad according to the second control signal, wherein the second resistance provider comprises:

M+1 first resistors, coupled between the second main driver and the pad in series, where M is a positive integer; and M first switches, coupled with M resistors of the M+1 first resistor in parallel, wherein the M first switches are controlled by the second control signal to be turned on or cut-off.

* * * * *